(12) United States Patent
Liou

(10) Patent No.: US 7,680,473 B2
(45) Date of Patent: Mar. 16, 2010

(54) CIRCUITS AND METHODS FOR SIGNAL GAIN CONTROL

(75) Inventor: Ming-Luen Liou, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 846 days.

(21) Appl. No.: 11/532,930

(22) Filed: Sep. 19, 2006

(65) Prior Publication Data

US 2008/0070535 A1 Mar. 20, 2008

(51) Int. Cl.
*H04B 1/06* (2006.01)
(52) U.S. Cl. ............... 455/235.1; 455/241.1; 455/247.1
(58) Field of Classification Search ............. 455/232.1, 455/234.1, 234.2, 235.1, 241.1, 242.1, 242.2, 455/245.2, 247.1, 250.1; 375/345
See application file for complete search history.

(56) References Cited

U.S. PATENT DOCUMENTS

2003/0083031 A1* 5/2003 Eriksson et al. .......... 455/250.1

2006/0115027 A1* 6/2006 Srebranig ................... 375/345

* cited by examiner

*Primary Examiner*—Nguyen Vo
(74) *Attorney, Agent, or Firm*—Thomas, Kayden, Horstemeyer & Risley

(57) ABSTRACT

A signal gain control circuit. A gain stage receives and amplifies an analog signal by a first gain factor adjusted by a gain adjusting signal in a periodic manner with a first period, and outputs an amplified signal. An analog to digital converter converts the amplified signal to a first digital signal comprising a stream of samples. An amplifying device adjusts a second gain factor in a periodic manner with a second period in accordance with a characteristic metric of the distribution of the first digital signal and multiplying the first digital signal by the second gain factor to generate a second digital signal. A first gain adjusting device detects a strength of the second digital signal and generates the gain adjusting signal according to the signal strength of the second digital signal in a periodic manner with the first period.

30 Claims, 5 Drawing Sheets

CIRCUITS AND METHODS FOR SIGNAL GAIN CONTROL

BACKGROUND OF THE INVENTION

1. Field of the Invention

The disclosure relates in general to automatic gain control (AGC) systems. In particular, the disclosure relates to circuits and methods for AGC systems with feedforward and feedback loops.

2. Description of the Related Art

The use of receivers in wireless systems such as radio and cellular communication systems is well-known in the art. A conventional technique for demodulating received signals is the use of a linear demodulator in conjunction with an automatic gain control (AGC) circuit to keep the input signal within the input range of the demodulator and/or within the input range of ADCs (analog to digital converters). An AGC circuit maintains an output within a linear operating region by adjusting the gain of an amplifier via feedback.

FIG. 1 shows a conventional AGC system. The AGC system comprises a voltage or current variable gain amplifier 10, a power computation processor 12 and a comparison circuit 14. An input signal 16 input to the AGC circuit is coupled to the variable gain amplifier 10. The power of output signal 18 is measured by the power computation processor 12 which performs an average or peak power measurement. The measured power is compared with a predefined value in the comparison circuit 14 which generates a gain control signal 19 corresponding to the difference in power level. The error signal 19 acts as a negative feedback and controls the gain of the variable gain amplifier 10. In response to the error signal 19, the variable gain amplifier 10 controls the magnitude of the output signal 18 with reference to the input signal 16. The AGC circuit maintains the output signal 18 within the linear operating region of the receiver and ADCs (not shown) employed to convert the analog signal to digital form. While AGCs obviate input overloads, the individual components within the AGC circuit contribute their own distortions.

In addition, whether implemented using analog components or some combination of digital and analog components, AGC arrangements provide for the use of other receiver components, such as ADCs, having more limited dynamic range than an overall desired operating dynamic range of a receiver. For example, if a receiver with digital signal processing functions operates in an environment where input signal level has a large dynamic range, either AGC or high resolution ADCs must be used. Unfortunately, the use of high resolution ADCs increases the manufacturing cost and power consumption of the receiver. Although AGC enables use of lower resolution ADCs, the aim of AGC is to maintain a scaled signal within a desired dynamic range, such that the amplitude of the scaled signal output from a variable-gain amplifier or gain stage does not vary significantly.

BRIEF SUMMARY OF THE INVENTION

Signal gain control circuits and methods thereof are provided. An exemplary embodiment of a signal gain control circuit comprises a gain stage receiving and amplifying an analog signal by a first gain factor adjusted by a gain adjusting signal in a substantially periodic manner with a first period, and outputting an amplified signal, an analog to digital converter coupled to the gain stage, converting the amplified signal to a first digital signal comprising a stream of samples, an amplifying device coupled to the analog to digital converter, adjusting a second gain factor in a substantially periodic manner with a second period in accordance with at least one characteristic metric of the distribution of the first digital signal and multiplying the first digital signal by the second gain factor to generate a second digital signal, and a first gain adjusting device coupled to the amplifying device, detecting a signal strength of the second digital signal and generating the gain adjusting signal according to the signal strength of the second digital signal in a substantially periodic manner with the first period.

An exemplary embodiment of a signal gain control method comprises receiving and amplifying an analog signal by a first gain factor adjusted by a gain adjusting signal in a substantially periodic manner with a first period, and outputting an amplified signal, converting the amplified signal to a first digital signal comprising a stream of samples, adjusting a second gain factor in a substantially periodic manner with a second period in accordance with at least one characteristic metric of the distribution of the first digital signal and multiplying the first digital signal by the second gain factor to generate a second digital signal, and detecting a signal strength of the second digital signal and generating the gain adjusting signal according to the signal strength of the second digital signal in a substantially periodic manner with the first period.

A detailed description is given in the following embodiments with reference to the accompanying drawings.

BRIEF DESCRIPTION OF THE DRAWINGS

The invention will become more fully understood from the detailed description, given hereinbelow, and the accompanying drawings. The drawings and description are provided for purposes of illustration only and, thus, are not intended to be limiting of the invention.

DETAILED DESCRIPTION OF THE INVENTION

Figure 1:
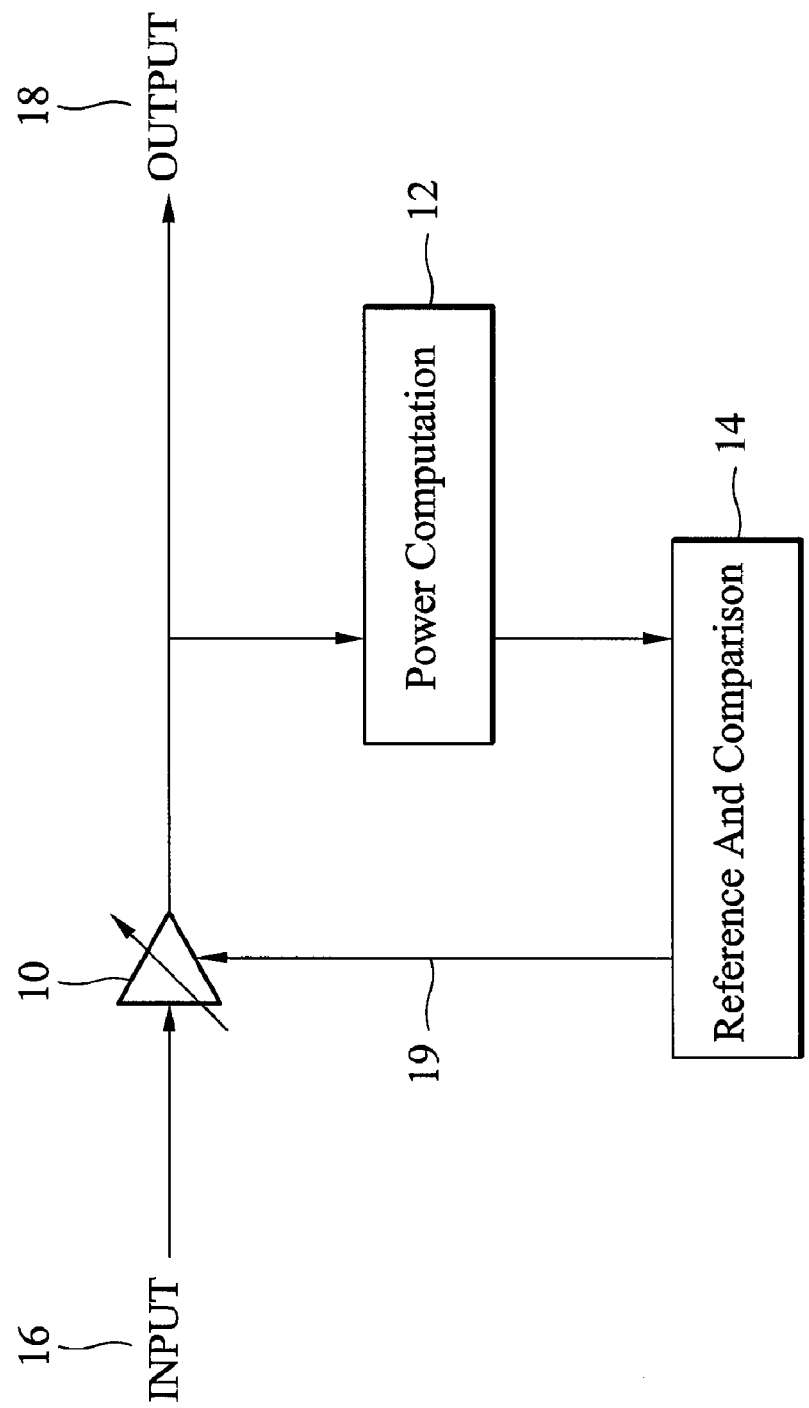
FIG. 1 shows a conventional AGC system.
Figure 2:
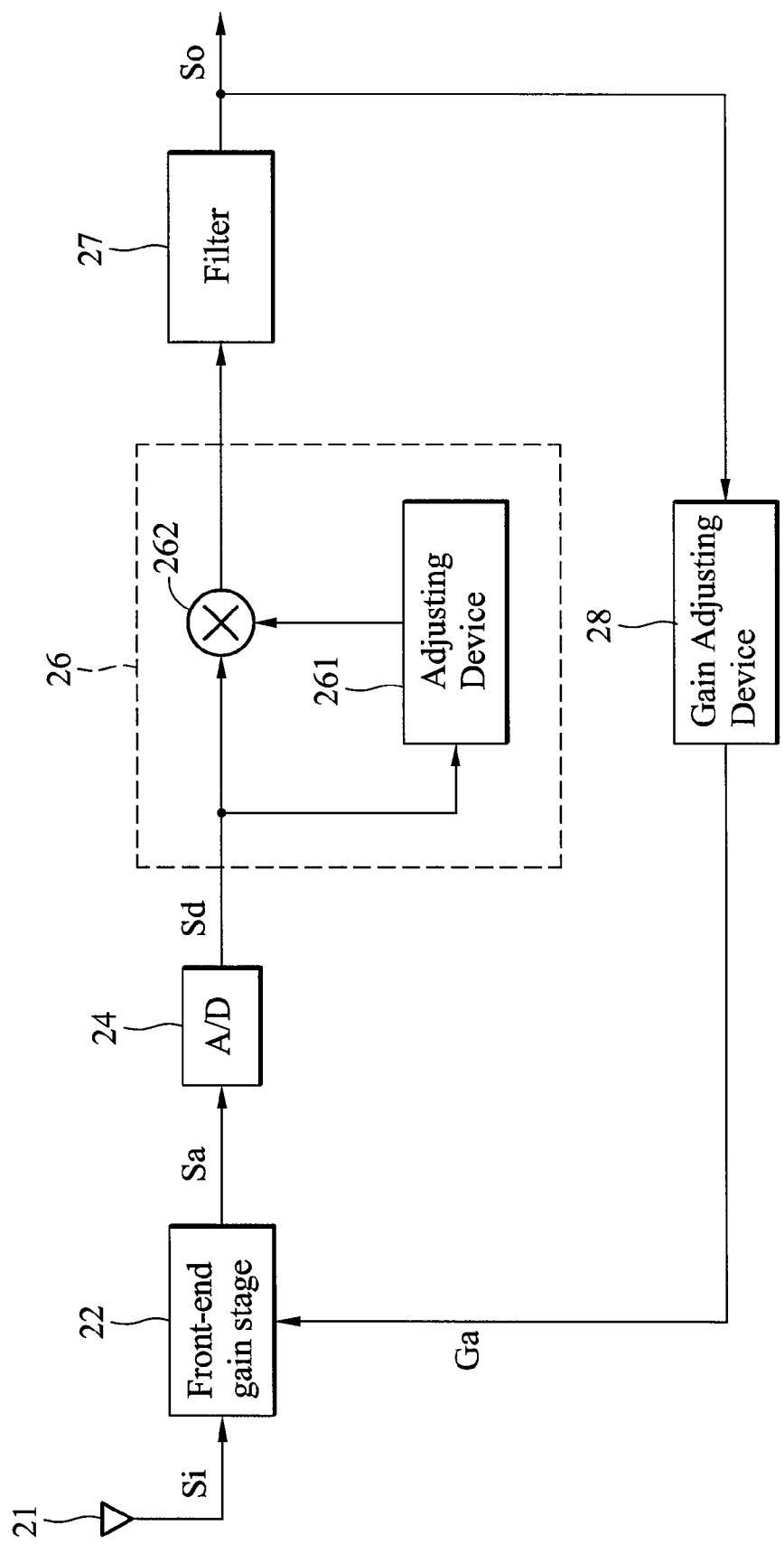
FIG. 2 is a block diagram of a signal gain control circuit according to an embodiment of the invention.

FIG. 2 is a block diagram of a signal gain control circuit according to an embodiment of the invention. Antenna 21 receives and feeds an analog signal Si to front-end gain stage 22. Analog signal Si may comprise a desired (in-channel) signal and unwanted (adjacent-channel or noise) signals. The front-end gain stage 22 receives and amplifies analog signal Si by a first gain factor so as to control the magnitude of amplified signal Sa. Here, the first gain factor of front-end gain stage 22 is controlled by gain adjusting signal Ga output from gain adjusting device 28, and the first gain factor is adjusted by front-end gain stage 22 in a substantially periodic manner with a first period.

The analog amplified signal Sa is converted to first digital signal Sd by ADC 24. An ADC has two important characteristics, the sampling rate and the input dynamic range. The sampling rate refers to how many times the ADC 24 samples the amplified signal Sa per second. The input dynamic range refers to a range of the input signal within which the ADC sampling can be performed without significant distortion. After conversion, the first digital signal Sd output from ADC 24 is a stream of samples.

Amplifying device 26 multiplies first digital signal Sd by a second gain factor to generate second digital signal So in a substantially periodic manner with a second period, wherein the second gain factor is adjusted based on at least one characteristic metric of the signal-level distribution of first digital signal Sd. Note that the second period exceeds the first period. Optionally, the second digital signal So can further be filtered by filter 27 to suppress adjacent channel interference (ACI) in second digital signal So.

As shown in FIG. 2, amplifying device 26 comprises gain adjusting device 261 and multiplier 262. In an iterative, preferably periodical fashion, gain adjusting device 261 calculates at least one characteristic metric of the distribution of the first digital signal, such as a large sample quantity over a second period of time, and adjusts the second gain factor accordingly. The definition of the large sample quantity will be described in FIGS. 3A and 3B. Multiplier 262 multiplies the first digital signal Sd by the second gain factor to generate the second digital signal So.

Thus, the values of the samples of first digital signal Sd are adjusted by changing the second gain factor according to the large sample quantity. According to an embodiment of the invention, the second gain factor is decreased when the large sample quantity is less than a first reference quantity, increased when the large sample quantity exceeds a second reference quantity, and unchanged when the large sample quantity exceeds the first reference quantity and is less than the second reference quantity. Here, the second reference value exceeds the first reference value.

Figure 3A:
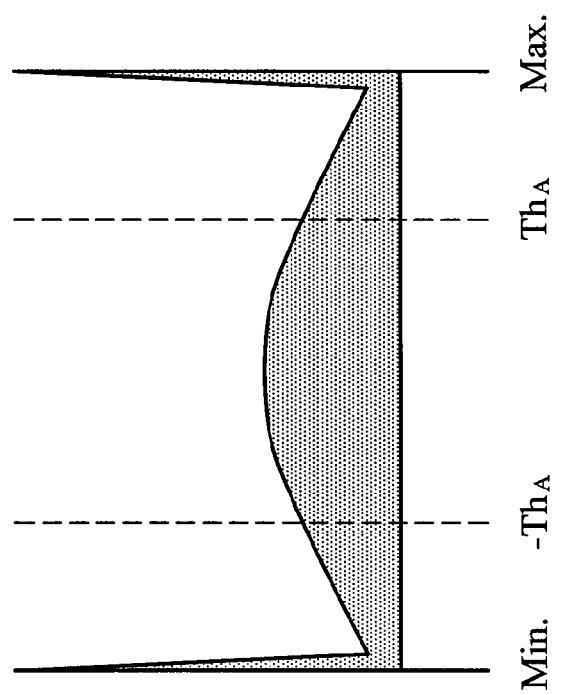
FIG. 3A and FIG. 3B show examples of sample distribution of the digital signal Sd output by ADC 24.
Figure 3B:
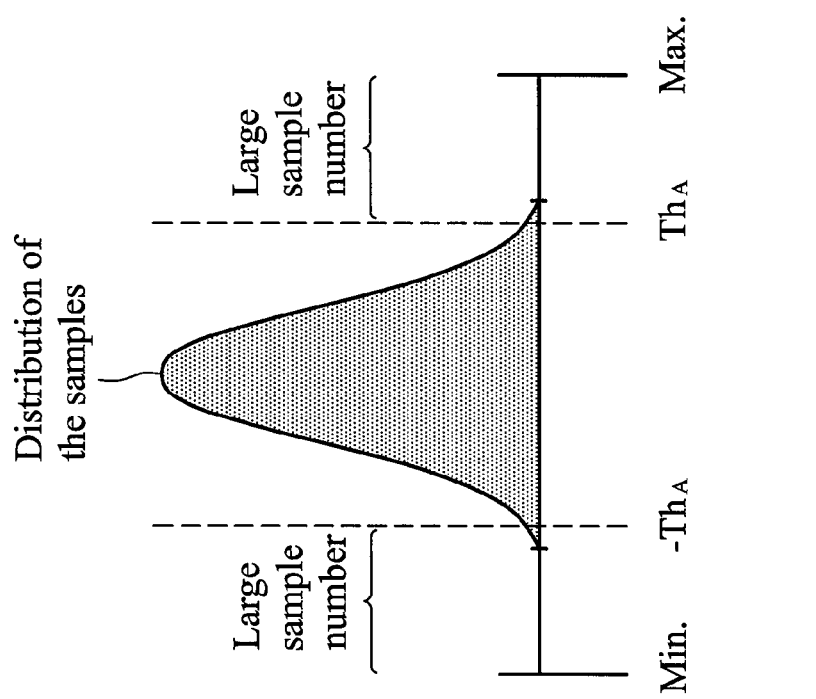

FIG. 3A and FIG. 3B show examples of the distribution of first digital signal Sd output by ADC 24. As mentioned, amplifying device 26 adjusts the second gain factor in accordance with a large sample quantity over a period of time to generate the second digital signal So. In one embodiment of the invention, the large sample quantity can be obtained by calculating the quantity of the samples of first digital signal Sd with value exceeding the range between the threshold $\pm Th_A$, or with the absolute value exceeding the threshold $Th_A$, such as between threshold $Th_A$ and Max, and between threshold $-Th_A$ and Min. In another embodiment, the large sample quantity can be obtained by calculating the quantity of samples with value between threshold $Th_A$ and Max, or by calculating the quantity of samples with value between threshold $-Th_A$ and Min.

In FIG. 3A, the sample distribution of the first digital signal Sd is to be extended. Thus, the second gain factor is decreased to decrease sample values of the samples of first digital signal Sd. On the contrary, sample distribution of the first digital signal Sd is to be narrowed in FIG. 3B, and the second gain factor increased to increase sample values of the samples of first digital signal Sd.

Gain adjusting device 28 detects a signal strength of second digital signal So and generates the gain adjusting signal Ga in a substantially periodic manner with the first period, according to the signal strength of second digital signal So and reference power. The signal strength of second digital signal So can be an average power or average envelope power thereof, measured by gain adjusting device 28. The measured power is compared with the reference power. Gain adjusting device 28 outputs the gain adjusting signal Ga indicating increase of the first gain factor to control the magnitude of amplified signal Sa when the measured power is lower than the reference power, and decreasing the first gain factor to control the magnitude of amplified signal Sa when the measured power exceeds reference power.

Figure 4:
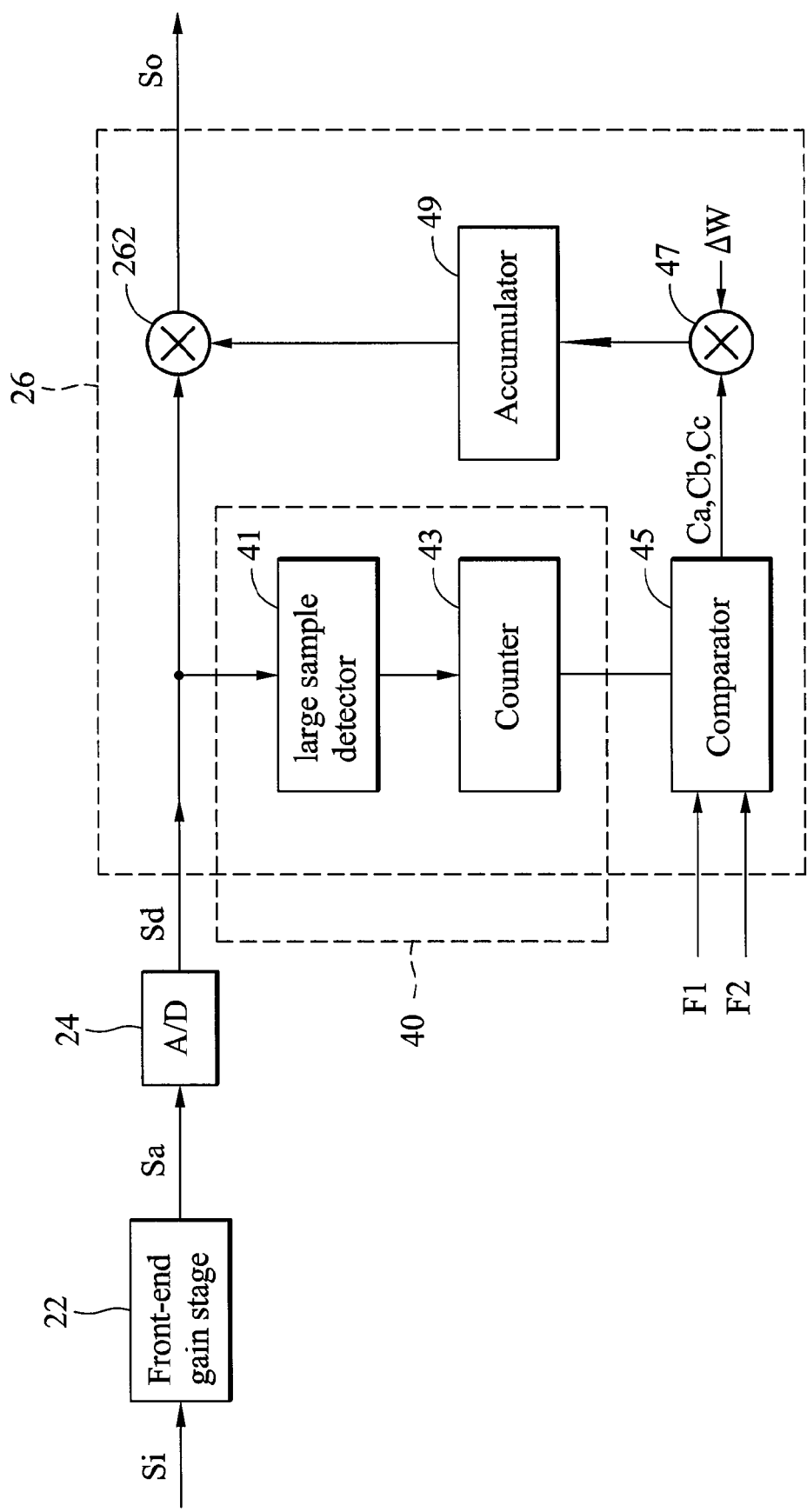
FIG. 4 shows an example of the amplifying device 26 according to an embodiment of the invention.

FIG. 4 shows an example of the amplifying device 26 according to an embodiment of the invention. Amplifying device 26 comprises large sample quantity calculator 40, comparator 45, multiplexers 47 and accumulator 49. Large sample quantity calculator 40 extracts at least one characteristic metric of the distribution of the first digital signal. In an embodiment of the invention, large sample quantity calculator 40 comprises large sample detector 41 and counter 43. Large sample detector 41 is coupled to the analog to digital converter 24 and compares samples of the first digital signal Sd with a predetermined range, and outputs a detection signal when a large sample with a value beyond the predetermined range is detected. In an embodiment of the invention, the predetermined range is between the boundaries $\pm Th_A$ shown in FIGS. 3A and 3B. When large sample detector 41 detects a large sample, the generated detection signal triggers counter 43 to calculate the large sample quantity within the second period.

Comparator 45 compares the large sample quantity accumulated within the second period with reference value F1 and reference value F2 exceeding the reference value F1. Comparator 45 outputs a first comparison signal Ca when the accumulated result is less than the first reference value F1, outputs a second comparison signal Cb when the accumulated result exceeds the second reference value F2, and outputs a third comparison signal Cc when the accumulated result is between reference values F1 and F2.

Multiplexer 47 multiplies the comparison signals by a predetermined step size $\Delta W$ and generates a negative, zero or positive weighting step size according to comparison signals Ca, Cb and Cc. For example, first comparison signal Ca indicates '−1', second comparison signal Cb indicates '+1', and third comparison signal Cc indicates '0', and multiplexer 47 outputs $-\Delta W$, $\Delta W$ or zero in response of the receipt of comparison signals Ca, Cb and Cc.

Accumulator 49 accumulates the multiplication result to generate the second gain factor. Thus, multiplexer 262 generates second digital signal So according to first digital signal Sd output from ADC 24 and the second gain factor. It is noted that large sample quantity calculator 40, comparator 45, multiplexers 47 and 262 and accumulator 49 form a feedforward loop.

Figure 5:
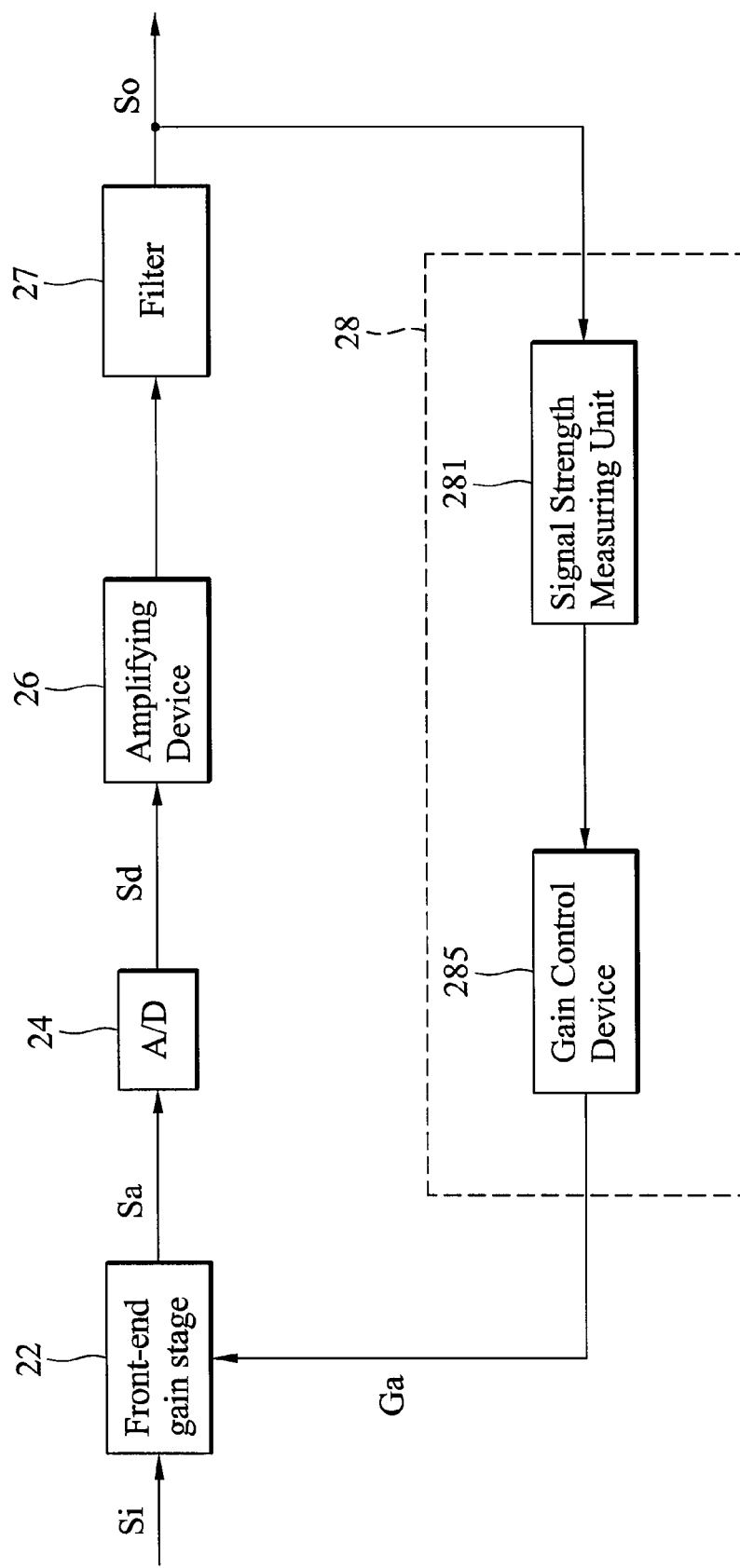
FIG. 5 shows an example of the gain adjusting device 28 according to an embodiment of the invention.

FIG. 5 shows an example of the gain adjusting device 28 according to an embodiment of the invention. Signal strength measuring unit 281 receives the second digital signal So and measures the signal strength thereof in a substantially periodic manner. Here, the signal strength can be an average power or average envelope of second digital signal So.

Gain control device 285 generates the gain adjusting signal Ga to increase the first gain factor if the signal strength of the second digital signal So is less than reference power, otherwise, generates the gain adjusting signal Ga to decrease the first gain factor. In FIG. 5, the signal strength measuring unit 281 and gain control device 285 form a feedback path to provide gain adjusting signal Ga to adjust the gain of the front-end gain stage 22.

According to the invention, first digital signal Sd is amplified by the amplifying device 26, and the signal strength of the second digital signal So adjusted by updating gain factor of gain adjusting device 28. Thus, the distribution of the samples of first digital signal Sd is adjusted by controlling gain factors of amplifying device 26 and the front-end gain stage 22. For example, if the quantity of samples of the first digital signal Sd beyond the predetermined range is less than reference value F1, the gain factor of amplifying device 26 is decreased. Thus, the signal strength of the second digital signal So may be less than reference power, and the gain factor of gain adjusting device 28 is increased accordingly to generate the second digital signal So with a desired sample distribution.

In addition, the update frequency of the gain factors of the front-end gain stage 22 and amplifying device 26 are different. As mentioned, the gain factor of front-end gain stage 22 is adjusted in a substantially periodic manner with a first period, and the gain factor of amplifying device 26 is adjusted in a substantially periodic manner with a second period exceeding the first period. Thus, the update of the gain factors of the front-end gain stage 22 and amplifying device 26 are in different frequency.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A signal gain control circuit, comprising:
    a gain stage receiving and amplifying an analog signal by a first gain factor adjusted by a gain adjusting signal in a substantially periodic manner with a first period, and outputting an amplified signal;
    an analog to digital converter coupled to the gain stage, converting the amplified signal to a first digital signal comprising a stream of samples;
    an amplifying device coupled to the analog to digital converter, adjusting a second gain factor in a substantially periodic manner with a second period in accordance with at least one characteristic metric of the distribution of the first digital signal and multiplying the first digital signal by the second gain factor to generate a second digital signal; and
    a first gain adjusting device coupled to the gain stage, detecting a signal strength of the second digital signal and generating the gain adjusting signal accordingly in a substantially periodic manner with the first period.

2. The signal gain control circuit as claimed in claim 1, wherein the second period exceeds the first period.

3. The signal gain control circuit as claimed in claim 1, wherein the amplifying device comprises:
    a second gain adjusting device calculating at least one characteristic metric of the distribution of the first digital signal, and adjusting the second gain factor according to the at least one characteristic metric; and
    a first multiplier multiplying the digital signal by the second gain factor to generate the second digital signal.

4. The signal gain control circuit as claimed in claim 3, wherein the at least one characteristic metric comprises a large sample quantity, a quantity of samples with value exceeding a first threshold.

5. The signal gain control circuit as claimed in claim 3, wherein the at least one characteristic metric comprises a large sample quantity, a quantity of samples with absolute value exceeding a first threshold.

6. The signal gain control circuit as claimed in claim 3, wherein the second gain adjusting device adjusts the second gain factor further according to a first reference quantity and a second reference quantity exceeding the first reference quantity.

7. The signal gain control circuit as claimed in claim 6, wherein the second gain adjusting device decreases the second gain factor when the characteristic metric is less than the first reference value.

8. The signal gain control circuit as claimed in claim 6, wherein the second gain adjusting device increases the second gain factor when the characteristic metric exceeds the second reference value.

9. The signal gain control circuit as claimed in claim 6, wherein the second gain adjusting device maintains the second gain factor unchanged when the characteristic metric exceeds the first reference value and less than the second reference value.

10. The signal gain control circuit as claimed in claim 6, wherein the at least one characteristic metric is a large sample quantity, and the second gain adjusting device comprises:
    a large sample detector coupled to the analog to digital converter, generating a detection signal indicating whether a sample of the first digital signal is a large sample;
    a counter triggered by the detection signal for calculating the large sample quantity within the second period;
    a second comparator comparing the large sample quantity with the first reference value and the second reference value, outputting a negative number when the large sample quantity is less than the first reference value, outputting a positive number when the large sample quantity exceeds the second reference value, and outputting a zero number when the large sample quantity exceeds the first reference value and is less than the second reference value;
    a second multiplier for multiplying the output number from the second comparator by a predetermined step size to generate a multiplication result; and
    an accumulator for accumulating the multiplication result to generate the second gain factor.

11. The signal gain control circuit as claimed in claim 1, wherein the signal strength of the second digital signal is an average power of the second digital signal.

12. The signal gain control circuit as claimed in claim 1, wherein the signal strength of the second digital signal is an average envelope of the second digital signal.

13. The signal gain control circuit as claimed in claim 1, wherein the first gain adjusting device comprises:
    a signal strength measuring unit receiving the second digital signal and measuring the signal strength of the second digital signal in a substantially periodic manner; and
    a gain control device coupled to the signal strength measuring unit, generating the gain adjusting signal to increase the first gain factor if the signal strength of the second digital signal is less than a second threshold, otherwise, adjusting the gain adjusting signal to decrease the first gain factor.

14. The signal gain control circuit as claimed in claim 1, further comprising a filter coupled between the amplifying device and the first gain adjusting device, to suppress interference in the second digital signal.

15. A signal gain control method, comprising:
    receiving and amplifying an analog signal by a first gain factor adjusted by a gain adjusting signal in a substantially periodic manner with a first period, and outputting an amplified signal;
    converting the amplified signal to a first digital signal comprising a stream of samples;
    adjusting a second gain factor in a substantially periodic manner with a second period in accordance with at least one characteristic metric of the distribution of the first digital signal and multiplying the first digital signal by the second gain factor to generate a second digital signal; and detecting a signal strength of the second digital signal and generating the gain adjusting signal according to the signal strength of the second digital signal in a substantially periodic manner with the first period.

16. The signal gain control method as claimed in claim 15, wherein the gain adjusting signal is generated in a periodic manner and the second gain factor is adjusted in a periodic manner.

17. The signal gain control method as claimed in claim 15, wherein the second period exceeds the first period.

18. The signal gain control method as claimed in claim 15, further comprising:
    calculating at least one characteristic metric of the distribution of the first digital signal;
    adjusting the second gain factor according to the at least one characteristic metric; and
    multiplying the digital signal by the second gain factor to generate the second digital signal.

19. The signal gain control method as claimed in claim 18, wherein the at least one characteristic metric comprises a large sample quantity, a quantity of samples with value exceeding a first threshold.

20. The signal gain control method as claimed in claim 18, wherein the at least one characteristic metric comprises a large sample quantity, a quantity of samples with absolute value exceeding a first threshold.

21. The signal gain control method as claimed in claim 18, wherein the second gain factor is adjusted according to a first reference quantity and a second reference quantity exceeding the first reference quantity.

22. The signal gain control method as claimed in claim 21, wherein the second gain factor is decreased when the characteristic metric is less than the first reference value.

23. The signal gain control method as claimed in claim 21, wherein the second gain factor is increased when the characteristic metric exceeds the second reference value.

24. The signal gain control method as claimed in claim 21, wherein the second gain factor is unchanged when the characteristic metric exceeds the first reference value and less than the second reference value.

25. The signal gain control method as claimed in claim 21, wherein the at least one characteristic metric is a large sample quantity.

26. The signal gain control method as claimed in claim 25, further comprising:
    generating a detection signal indicating whether a sample of the first digital signal is a large sample;
    calculating the large sample quantity within the second period according to the detection signal;
    comparing the large sample quantity with the first reference value and the second reference value;
    outputting a negative number when the large sample quantity is less than the first reference value, outputting a positive number when the large sample quantity exceeds the second reference value, and outputting a zero number when the large sample quantity exceeds the first reference value and is less than the second reference value;
    multiplying the output number from the second comparator by a predetermined step size to generate a multiplication result; and
    accumulating the multiplication result to generate the second gain factor.

27. The signal gain control method as claimed in claim 15, wherein the signal strength of the second digital signal is an average power of the second digital signal.

28. The signal gain control method as claimed in claim 15, wherein the signal strength of the second digital signal is an average envelope of the second digital signal.

29. The signal gain control method as claimed in claim 15, further comprising:
    receiving the second digital signal and measuring a signal strength of the second digital signal in a substantially periodic manner; and
    generating the gain adjusting signal to increase the first gain factor if the signal strength of the second digital signal is less than a second threshold, otherwise, adjusting the gain adjusting signal to decrease the first gain factor.

30. The signal gain control method as claimed in claim 15, further comprising suppressing interference in the second digital signal.

* * * * *